United States Patent
Aziz et al.

(10) Patent No.: US 7,645,525 B2
(45) Date of Patent: Jan. 12, 2010

(54) ORGANIC LIGHT EMITTING DEVICES

(75) Inventors: Hany Aziz, Oakville (CA); Zoran D. Popovic, Mississauga (CA); Nan-Xing Hu, Oakville (CA); Jennifer A. Coggan, Cambridge (CA); Anthony J. Paine, Mississauga (CA)

(73) Assignee: LG Display Co., Ltd., Seoul (KR)

( * ) Notice: Subject to any disclaimer, the term of this patent is extended or adjusted under 35 U.S.C. 154(b) by 450 days.

(21) Appl. No.: 11/316,877

(22) Filed: Dec. 27, 2005

(65) Prior Publication Data

US 2007/0145886 A1 Jun. 28, 2007

(51) Int. Cl.
*H01L 51/54* (2006.01)

(52) U.S. Cl. .................. 428/690; 428/917; 313/504; 313/506; 257/E51.026; 257/102; 257/103

(58) Field of Classification Search .............. 428/690, 428/917; 313/502–509; 257/40, 88–103, 257/E51.001–E51.052; 252/301.16–301.35
See application file for complete search history.

(56) References Cited

U.S. PATENT DOCUMENTS

| | | | |
|---|---|---|---|
| 3,172,862 A | 3/1965 | Gurnee et al. | |
| 3,530,325 A | 9/1970 | Mehl et al. | |
| 4,356,429 A | 10/1982 | Tang | |
| 4,539,507 A | 9/1985 | Vanslyke et al. | |
| 4,720,432 A | 1/1988 | VanSlyke et al. | |
| 4,769,292 A | 9/1988 | Tang et al. | |
| 4,885,211 A | 12/1989 | Tang et al. | |
| 5,141,671 A | 8/1992 | Bryan et al. | |
| 5,150,006 A | 9/1992 | Vanslyke et al. | |
| 5,151,629 A | 9/1992 | VanSlyke et al. | |
| 5,227,252 A | 7/1993 | Murayama et al. | |
| 5,276,381 A | 1/1994 | Wakimoto et al. | |
| 5,281,489 A * | 1/1994 | Mori et al. | 428/690 |
| 5,409,783 A | 4/1995 | Tang et al. | |
| 5,429,884 A | 7/1995 | Namiki et al. | |
| 5,516,577 A | 5/1996 | Matsuura et al. | |
| 5,593,788 A | 1/1997 | Shi et al. | |
| 5,601,903 A | 2/1997 | Fujii et al. | |
| 5,728,801 A | 3/1998 | Wu et al. | |
| 5,846,666 A | 12/1998 | Hu et al. | |
| 5,853,905 A | 12/1998 | So et al. | |
| 5,925,472 A | 7/1999 | Hu et al. | |

(Continued)

FOREIGN PATENT DOCUMENTS

JP   5-241525 A   9/1993

(Continued)

OTHER PUBLICATIONS

Fukumura et al., "Temperature effect on inverse intersystem crossing of anthracenes," Journal of Photochemistry and Photobiology, A: Chemistry, vol. 42, No. 2-3, pp. 283-291, Apr. 1988.*

(Continued)

*Primary Examiner*—Dawn Garrett
(74) *Attorney, Agent, or Firm*—McKenna Long & Aldridge

(57) ABSTRACT

An organic electroluminescent device includes an anode, a cathode, and a light emitting zone including a material that at least one of reduces triplet/triplet interaction, reduces triplet/singlet interaction, and reduces singlet/singlet interaction.

11 Claims, 1 Drawing Sheet

U.S. PATENT DOCUMENTS

| | | | |
|---|---|---|---|
| 5,925,980 | A | 7/1999 | So et al. |
| 5,935,720 | A | 8/1999 | Chen et al. |
| 5,942,340 | A | 8/1999 | Hu et al. |
| 5,952,115 | A | 9/1999 | Hu et al. |
| 6,057,048 | A | 5/2000 | Hu et al. |
| 6,114,055 | A | 9/2000 | Choong et al. |
| 6,130,001 | A | 10/2000 | Shi et al. |
| 6,224,966 | B1 * | 5/2001 | Sakai et al. ............... 428/212 |
| 6,310,360 | B1 * | 10/2001 | Forrest et al. ............... 257/40 |
| 6,465,115 | B2 | 10/2002 | Shi et al. |
| 6,479,172 | B2 | 11/2002 | Hu et al. |
| 6,562,485 | B2 | 5/2003 | Hu et al. |
| 6,565,996 | B2 | 5/2003 | Hatwar et al. |
| 6,734,621 | B2 * | 5/2004 | Koyama et al. ............ 313/503 |
| 6,821,643 | B1 | 11/2004 | Hu et al. |
| 2002/0093006 | A1 * | 7/2002 | Vardeny et al. ......... 252/301.16 |
| 2002/0146589 | A1 * | 10/2002 | Akiyama et al. ............ 428/690 |
| 2004/0190105 | A1 * | 9/2004 | Bussmann et al. .......... 359/248 |
| 2005/0095456 | A1 * | 5/2005 | Takeda ...................... 428/690 |
| 2005/0175857 | A1 | 8/2005 | Coggan et al. |
| 2006/0232194 | A1 * | 10/2006 | Tung et al. ................. 313/504 |

FOREIGN PATENT DOCUMENTS

| | | |
|---|---|---|
| JP | 07-150137 | 6/1995 |
| KR | 1020060029866 A | 4/2006 |

OTHER PUBLICATIONS

Boas et al., "Synthesis and Properties of New Thiourea-Functionalized Poly(propylene imine) Dendrimers and Their Role as Hosts for Urea Functionalized Guests," Journal of Organic Chemistry, vol. 66, No. 6, pp. 2136-2145, Mar. 2001.*

Precup-Blaga et al., "Highly Emissive Supramolecular Oligo(p-phenylene vinylene) Dendrimers," Journal of the American Chemical Society, vol. 125, No. 42, pp. 12953-12960, May 2003.*

Shoustikov et al. "Electroluminescence Color Tuning by Dye Doping in Organic Light-Emitting Diodes," vol. 4, No. 1, Jan./Feb. 1998.*

S. A. Van Slyke et al., "Organic Electroluminescent Devices with Improved Stability," Appl. Phys. Lett. 69(15), pp. 2160-2162 (1996).

Kido et al., "Organic Electroluminescent Devices Based On Molecularly Doped Polymers," Appl. Phys. Lett. 61(7), pp. 761-763, (1992).

S. Naka et al., "Organic Electroluminescent Devices Using a Mixed Single Layer," Jpn. J. Appl. Phys. vol. 33, pp. L1772-L1774 (1994).

W. Wen et al., "Single-Layer Organic Electroluminescent Devices by Vapor Deposition Polymerization", Appl. Phys. Lett. 71 (10), 1302-1304 (1997).

C. Wu et al., "Efficient Organic Electroluminescent Devices Using Single-Layer Doped Polymer Thin Films with Bipolar Carrier Transport Abilities", IEEE Transactions on Electron Devices 44, vol. 44 No. 8, pp. 1269-1281 (1997).

Y. Hamada et al., "Influence of the Emission Site on the Running Durability of Organic Electroluminescent Devices", Jpn. J. Appl. Phys. 34, pp. L824-L826 (1995).

Bernius et al., "Deng Materials and Devices III," Denver, Colo., vol. 3797, p. 129-137 (1999).

Kido et al., "White-Light-Emitting Organic Electroluminescent Device Using. Lanthanide Complexes", Jpn. J. Appl;. Phys., vol. 35, pp. L394-L396 (1996).

Baldo et. al., "Highly Efficient Organic Phosphorescent Emission from Organic Electroluminescent Devices," Letters to Nature, vol. 395, pp. 151-154 (1998).

* cited by examiner

ORGANIC LIGHT EMITTING DEVICES

BACKGROUND OF THE INVENTION

1. Field of the Invention

This invention relates to optoelectronic devices, and more particularly, to organic light emitting devices (organic EL devices). More specifically, the present invention relates to substantially stable blue light emitting organic EL devices.

2. Discussion of the Prior Art

An organic electroluminescent (EL) device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent material and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is completely incorporated herein by reference. These types of devices are believed to require excitation voltages on the order of 100 volts or greater.

An organic EL device with a multilayer structure can comprise one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are completely incorporated herein by reference. In U.S. Pat. No. 4,769,292, the disclosure of which is completely incorporated herein by reference, an organic EL device comprises three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is completely incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," Appl. Phys. Lett. 69, pp. 2160-2162, 1996, the disclosure of which is completely incorporated herein by reference.

There have also been attempts to obtain electroluminescence from organic light emitting devices containing mixed layers, for example, layers in which both the hole transport material and the emitting electron transport material are mixed together in one single layer, such as in, for example, Kido et al., "Organic Electroluminescent Devices Based On Molecularly Doped Polymers," Appl. Phys. Lett. 61, pp. 761-763, 1992; S. Naka et al., "Organic Electroluminescent Devices Using a Mixed Single Layer," Jpn. J. Appl. Phys. 33, pp. L1772-L1774, 1994; W. Wen et al., Appl. Phys. Lett. 71, 1302 (1997); and C. Wu et al., "Efficient Organic Electroluminescent Devices Using Single-Layer Doped Polymer Thin Films with Bipolar Carrier Transport Abilities", IEEE Transactions on Electron Devices 44, pp. 1269-1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are completely incorporated herein by reference.

While recent progress in organic EL research has elevated the potential of organic EL devices for widespread applications, the operational stability of currently available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," Appl. Phys. Lett. 69, pp. 2160-2162, 1996, and doping as described, for example, in Y. Hamada et al., "Influence of the Emission Site on the Running Durability of Organic Electroluminescent Devices", Jpn. J. Appl. Phys. 34, pp. L824-L826, 1995, may perhaps increase the operational lifetime of organic light emitting devices for room temperature operation, however, the effectiveness of these organic light emitting devices deteriorates for high temperature device operation.

Particularly, in order to realize full-color displays, the development of OLEDs emitting in the red, green and blue regions of the visible spectrum is necessary. Although recent advances have led to the development of green and red emitting OLEDs with improved performance in commercial applications, the operational stability of blue-emitting OLEDs is still particularly unsatisfactory.

SUMMARY OF THE INVENTION

An exemplary embodiment of an organic electroluminescent device comprises an anode, a cathode, and a light emitting zone including a material that reduces triplet/triplet interaction, triplet/singlet interaction, and singlet/singlet interaction.

The material can be a triplet quenching material, a material with strong spin orbit coupling properties, a material with strong absorption properties at second triplet states and second singlet states or, a material that increases the intermolecular distances between light emitting molecules. Moreover, the device can be arranged such that recombination of electrons and holes in the light emitting region occurs within a magnetic field.

BRIEF DESCRIPTION OF THE DRAWINGS

Preferred embodiments of this invention will be described in detail, with reference to the following figures, in which.

DETAILED DESCRIPTION OF PREFERRED EMBODIMENTS

Figure 1:
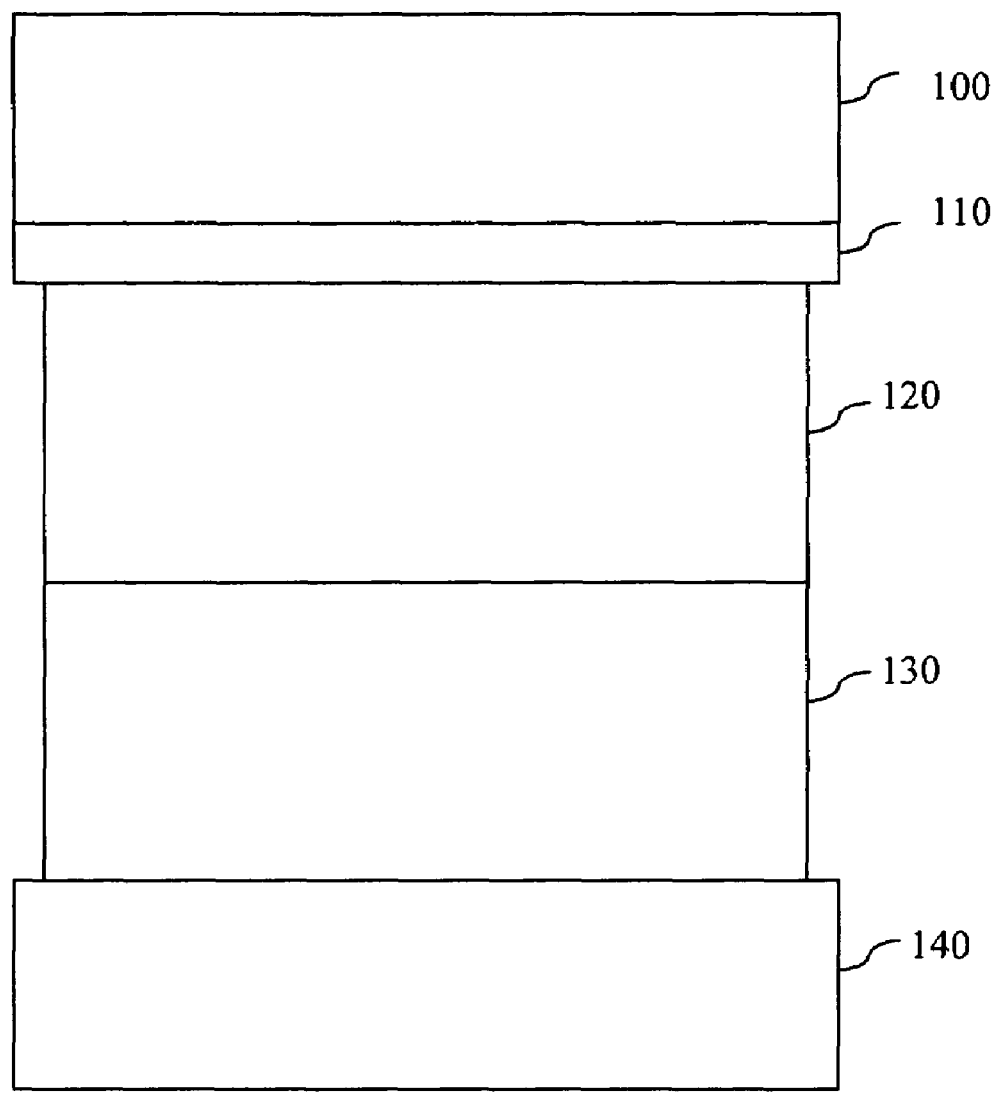
FIG. 1 illustrates an exemplary embodiment of an organic light emitting device according to this invention.

This invention provides organic light emitting devices (OLEDs) having improved performance.

Exemplary embodiments of the light emitting devices according to this invention comprise an anode, a cathode and a light emission zone between the anode and cathode. The light emission zone can comprise a wide range of different organic light emitting materials.

To avoid confusion in understanding the scope of the present invention, the following guidelines can be used:

The term "layer" indicates a single coating generally having a composition that differs from the composition of an adjacent layer;

The term "region" refers to a single layer, a plurality of layers such as two, three or more layers;

The term "zone," as used in the context of the light emitting zone, refers to a single layer, a plurality of layers, a single functional area in a layer, a plurality of functional areas in a layer, or one or more regions;

Generally, all regions and layers of the display device that are between the two electrodes or that participate in the charge conduction processes needed to operate the display device are considered part of either the cathode, luminescent zone, or anode;

Generally, a layer (e.g., substrate) that does not participate in the charge conduction processes of the display device and that can be viewed as being outside of the two electrodes shall not be considered part of the electrodes; such a layer (e.g., substrate), however, still may be considered a part of the display device; and "Light emission zone," "light emitting zone," and "luminescent zone" are used interchangeably.

FIG. 1 illustrates an exemplary embodiment of an organic light emitting device (OLED) 1 according to this invention. The organic light emitting device 1 comprises a substrate 100; an anode 110 adjacent the substrate 100; a hole transport region 120 adjacent the anode 110; an electron transport region 130 adjacent the hole transport region 120; and a cathode 140 adjacent the electron transport region 130.

Although FIG. 1 illustrates a device with two regions, the device of the present invention can have one or more region and one or more layers. For example, the device of the present invention can be a single layer device, a bi-layer device or a three layer device.

Generally, the hole transport region 120 and electron transport region 130 are collectively referred to as the light emission or luminescent zone. During operation, an applied electric field causes positive charges (holes) and negative charges (electrons) to be respectively injected into the light emitting zone from the anode 110 and the cathode 140 to recombine and thereby produce light emission in the light emission zone.

The light emission zone is comprised of an organic light emitting material. Examples of suitable organic light emitting materials can be selected, for example, from metal oxinoid compounds, stilbene compounds, anthracene compounds, oxadiazole metal chelate compounds, polyfluorenes, polyphenylenevinylenes and derivatives and mixtures thereof. Other suitable organic light emitting materials are described below.

The hole transport region 120 can include suitable hole transport materials, such as, for example, polyphenylenevinylenes, polythiophenes, tertiary aromatic amines, and indolocarbazole compounds and other materials; and suitable electron transport materials, such as, for example, metal oxinoids, triazines, oxadiazole metal chelate, stilbenes, polyfluorenes and other materials.

Embodiments of the organic light emitting devices can be fabricated to emit light over a broad range of wavelengths. By the selection of suitable combinations and mixtures of the emitting materials, hole transport materials and electron transport materials, light emission can be achieved at wavelengths of from about 400 nm to about 700 nm from the organic light emitting devices. Accordingly, the organic light emitting devices of this invention can emit light having a range of different colors by appropriate material selection. This versatility of emission colors enables the organic light emitting devices of this invention to be used in various applications where certain specific light colors, such as red, green or blue are desired. The device of the present invention is particularly useful for emitting a blue color.

Various emitting materials, hole transport materials and electron transport materials are known in the art, as also is their combined selection to achieve desired color emissions. Furthermore, the selection of such materials to provide a desired color emission can be readily conducted by one of ordinary skill in the art using routine experimentation.

Embodiments of the organic light emitting devices can be operated under alternating current (AC) and/or direct current (DC) driving conditions. AC driving conditions may provide extended operational lifetimes.

The different portions of the organic light emitting devices according to this invention will now be described in greater detail.

The substrate 100 can comprise any suitable material. For example, the substrate 100 can comprise polymeric components, glass, quartz and the like. Suitable polymeric components include, but are not limited to, polyesters such as MYLAR™, polycarbonates, polyacrylates, polymethacrylates, polysulfones and the like. Mixtures of these various materials can also be used. Other substrate materials can also be provided that the materials can effectively support the other layers, and do not interfere with the device functional performance. The substrate 100 can formed of a light transmission material.

The thickness of the substrate 100 is not particularly limited except by the structural demands of the organic light emitting device and its intended use. The substrate can typically have a thickness, for example, of from about 25 μm to at least about 1,000 μm.

The anode 110 formed on the substrate 100 can comprise any suitable known or later developed material. For example, positive charge injecting electrodes such as indium tin oxide (ITO), tin oxide, gold and platinum can be used. Other suitable materials for the anode include, but are not limited to, electrically conductive carbon, π-conjugated polymers such as polyaniline, polypyrrole and the like having, for example, a work function of at least about 4 eV, and preferably from about 4 eV to about 6 eV.

The anode 110 can have any suitable structure. A thin conductive layer can be coated onto a light transmissive substrate, such as, for example, a transparent or substantially transparent glass plate or plastic film. Embodiments of the organic light emitting devices according to this invention can comprise a light transmissive anode formed from tin oxide or indium tin oxide (ITO) coated on a glass plate. Also, very thin light-transparent metallic anodes having a thickness, for example, of less than about 200 Å, and, preferably from about 75 Å to about 150 Å can be used. These thin anodes can comprise metals such as gold, palladium and the like. In addition, transparent or semi-transparent thin layers of conductive carbon or the above-mentioned conjugated polymers, having a thickness of, for example from 50 Å to about 175 Å can be used as anodes. Additional suitable forms of the anode 110 (and the cathode 140 as described in greater detail below) are disclosed in U.S. Pat. No. 4,885,211, which is incorporated herein by reference in its entirety.

The thickness of the anode 110 can range from about 1 nm to about 500 nm, with the exemplary thickness range depending on the optical constants of the anode material. One exemplary range of thickness of the anode is from about 30 nm to about 300 nm. Of course, thicknesses outside of this range can also be used.

The light emitting zone can comprise any suitable known or later developed one or more materials comprising an organic light emitting material. Suitable organic light emitting materials that can be utilized in the light emitting zone include the polyphenylenevinylenes, such as, for example, poly(p-phenylenevinylene) (PPV), poly(2-methoxy-5-(2-ethylhexyloxy)1,4-phenylenevinylene) (MEHPPV); poly(2, 5-dialkoxyphenylenevinylene) (PDMeOPV), and other materials disclosed in U.S. Pat. No. 5,247,190, which is incorporated herein by reference in its entirety.

Other suitable organic light emitting materials that can be utilized in the light emitting zone include the polyphenylenes, such as, for example, poly(p-phenylene) (PPP), ladder-poly-para-phenylene (LPPP) and poly(tetrahydropyrene) (PTHP).

Still other suitable exemplary organic light emitting materials that can be utilized in the light emitting zone are the polyfluorenes, such as, for example, poly(9,9-di-n-octylfluorene-2,7-diyl), poly(2,8-(6,7,12,12-tetraalkylindenofluorene), and also copolymers containing fluorenes such as fluorene-amine copolymers, as described, for example, in Bernius et al., "Proceedings of SPIE Conference on Organic Light Emitting Materials and Devices III," Denver, Colo., July 1999, Vol. 3797, p. 129, which is incorporated herein by reference in its entirety.

An exemplary class of organic light emitting materials that can be utilized in the light emitting zone includes, but is not limited to, the metal oxinoid compounds as disclosed in U.S. Pat. Nos. 4,539,507; 5,151,629; 5,150,006; 5,141,671 and 5,846,666, which are each incorporated herein by reference in their entirety. Illustrative examples include tris(8-hydroxyquinolinate)aluminum($AlQ_3$), which is one exemplary example, and bis(8-hydroxyquinolato)-(4-phenylphenolato) aluminum (BAlQ), which is another exemplary example. Other examples of this class of materials include tris(8-hydroxyquinolinate)gallium, bis(8-hydroxyquinolinate)magnesium, bis(8-hydroxyquinolinate)zinc, tris(5-methyl-8-hydroxyquinolinate)aluminum, tris(7-propyl-8-quinolinolato) aluminum, bis[benzo{f}-8-quinolinate]zinc, bis(10-hydroxybenzo[h]quinolinate)beryllium, and the like, and metal thioxinoid compounds disclosed in U.S. Pat. No. 5,846, 666, such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Exemplary materials are bis(8-quinolinethiolato)zinc, bis(8-quinolinethiolato)cadmium, tris(8-quinolinethiolato)gallium, tris(8-quinolinethiolato)indium and bis[benzo[{f}-8-quinolinethiolato]zinc.

Another exemplary class of organic light emitting materials which can be used in the light emitting zone comprises stilbene derivatives, such as those disclosed in U.S. Pat. No. 5,516,577, incorporated herein by reference in it entirety. An exemplary stilbene derivative is 4,4'-bis(2,2-diphenylvinyl) biphenyl.

Another class of suitable organic light emitting materials for forming the light emitting zone are the oxadiazole metal chelates disclosed in co-pending U.S. patent application Ser. No. 08/829,398, filed Mar. 31, 1997, and incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis [2-(2-hydroxyphenyl)-5-(1-naphthyl)-1,3,4-oxadiazolato] zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato] zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato] zinc; bis[2-(2-hydroxy-4-methylphenyl)-5-phenyl-1,3,4-oxadiazolato]zinc; bis[2-.alpha.-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; bis[2-(2-hydroxyphenyl)-5-(1-naphthyl)-1,3,4-thiadiazolato] beryllium, and the like.

Another class of suitable organic light emitting materials that can be utilized in the light emitting zone are the triazines, as disclosed in U.S. Pat. No. 6,057,048 and co-pending U.S. patent application Ser. No. 09/489,144, filed Jan. 21, 2000, which are each incorporated herein by reference in their entirety.

Another class of suitable organic light emitting materials that can be utilized in the light emitting zone are the anthracenes.

Other exemplary examples of organic light emitting materials that can be utilized in the light emitting zone are fluorescent materials, such as, for example, coumarin, dicyanomethylene pyranes, polymethine, oxabenzanthrane, xanthene, pyrylium, carbostyl, perylene, and the like. Another specially exemplary class of fluorescent materials are the quinacridone dyes. Illustrative examples of quinacridone dyes include quinacridone, 2-methylquinacridone, 2,9-dimethylquinacridone; 2-chloroquinacridone; 2-fluoroquinacridone; 1,2-benzoquinacridone; N,N'-dimethylquinacridone; N,N'-dimethyl-2-methylquinacridone; N,N'-dimethyl-2,9-dimethylquinacridone; N,N'-dimethyl-2-chloroquinacridone; N,N'-dimethyl-2-fluoroquinacridone; N,N'-dimethyl-1,2-benzoquinacridone, and the like, as disclosed in U.S. Pat. Nos. 5,227,252; 5,276,381 and 5,593,788, which are each incorporated herein in their entirety. Another exemplary class of fluorescent materials are fused ring fluorescent dyes. Examples of the fused ring fluorescent dyes include perylene, rubrene, anthracene, coronene, phenanthrecene, pyrene, and the like, as illustrated in U.S. Pat. No. 3,172,862, which is incorporated herein by reference in its entirety. Also, fluorescent materials include butadienes, such as 1,4-diphenylbutadiene and tetraphenylbutadiene, stilbenes, and the like, as disclosed in U.S. Pat. Nos. 4,356,429 and 5,516,577, which are each incorporated herein by reference in their entirety. Other exemplary fluorescent materials that can be used are disclosed in U.S. Pat. No. 5,601,903, which is incorporated herein by reference in its entirety.

Another exemplary class of organic light emitting materials that can be utilized in the light emitting zone are fluorescent dyes, as disclosed in U.S. Pat. No. 5,935,720, which is incorporated herein by reference in its entirety. Exemplary materials include, for example, 4-(dicyanomethylene)-2-1-propyl-6-(1,1,7,7-tetramethyljulolidyl-9-enyl)-4H-pyran (DCJTB).

Another exemplary class of organic light emitting materials that can be utilized in the light emitting zone are lanthanide metal chelate complexes, such as, for example, tris (acety lacetonato)(phenanthroline)terbium, tris(acetyl acetonato)(phenanthroline)europium, and tris(thenoyl trisfluoroacetonato)(phenanthroline)europium, as disclosed in Kido et al., "White Light Emitting Organic Electroluminescent Device Using Lanthanide Complexes," Jpn.J.Appl.Phys., Vol. 35, pp. L394-L396 (1996), which is incorporated herein by reference in its entirety.

Another exemplary class of organic light emitting materials that can be utilized in the light emitting zone are the phosphorescent materials, such as, for example, organometallic compounds containing heavy metal atoms that lead to strong spin-orbit coupling, such as those compounds disclosed in Baldo et. al., "Highly Efficient Organic Phosphorescent Emission from Organic Electroluminescent Devices," Letters to Nature, Vol. 395, pp 151-154 (1998). Exemplary examples include 2,3,7,8,12,13,17,18-octaethyl-21H23H-phorpine platinum(II) (PtOEP) and fac tris(2-phenylpyridine)iridium (Ir(ppy)$_3$).

Without limitation on the usefulness of the organic light emitting materials discussed herein, a blue organic light emitting material may be for example a polyfluorene, an anthracene derivative, such as those described, for example in U.S. Pat. No. 6,479,172, U.S. Pat. No. 6,562,485, U.S. Pat. No. 6,465,115, and U.S. Pat. No. 6,565,996, like 9,10-diphenylanthracene ("DPA"), 9,10-bis[4-2,2-diphenylethenyl) phyenyl]anthracene, and tertiary-butyl substituted 9,10-bis [4-(2,2-diphenylethenyl)phenyl]anthracene also sometimes given the acronym "BH2"), a stilbene derivative such as those described above, a triazine derivative, such as those described in U.S. Pat. No. 6,229,012, a carbazole derivative including bicarbozole derivatives, or a binaphtyl derivative, such as those described in U.S. application Ser. No. 10/774,577, filed Feb. 10, 2004. These disclosures of the cited patents and applications are fully incorporated herein by reference.

A light emitting zone that generates white light can, for example, comprise two or more layers where at least one layer generates blue emission and at least one layer generates yellow, orange or red emission. The one or more layers generating blue emission can, for example, comprises one or more of the blue electroluminescent materials described herein, and the one or more layers generating the yellow, orange or red emission can be comprises of any of the electroluminescent material capable of emission at the desired color range or by adding luminescent dopants, as those described herein, in a suitable electroluminescent material. Alternatively, a white emitting zone or region that generates white light can consist of a single layer comprises of a blue electroluminescent material that further includes a yellow, orange, or red luminescent dopant in a low concentration, for example less than about 2% by volume, and typically, less than about 1% by volume, and sometimes even less than about 0.5% volume, where the low concentration of dopant allows the partial retention of blue emission from the blue electroluminescent material, which when combined with the yellow, orange, or red emission components from the dopant, gives the white emission.

The hole transport material that can be utilized in the present invention can be any suitable known or later developed material.

Exemplary hole-transporting materials include polypyrrole, polyaniline, poly(phenylene vinylene), polythiophene, polyarylamine (which are disclosed in U.S. Pat. No. 5,728,801, incorporated herein by reference in its entirety) and their derivatives, and known semiconductive organic materials; porphyrin derivatives such as 1,10,15,20-tetraphenyl-21H, 23H-porphyrin copper (II) disclosed in U.S. Pat. No. 4,356,429, incorporated herein by reference in its entirety; copper phthalocyanine, copper tetramethyl phthalocyanine, zinc phthalocyanine, titanium oxide phthalocyanine, magnesium phthalocyanine and the like.

An exemplary class of hole transporting materials that can be utilized are the aromatic tertiary amines such as those disclosed in U.S. Pat. No. 4,539,507, which is incorporated herein by reference in its entirety. Suitable exemplary aromatic tertiary amines include, for example, bis(4-dimethylamino-2-methylphenyl)phenylmethane; N,N,N-tri(p-tolyl) amine; 1,1-bis(4-di-p-tolylaminophenyl)cyclohexane; 1,1-bis(4-di-p-tolylaminophenyl)-4-phenyl cyclohexane; N,N'-diphenyl-N,N'-bis(3-methylphenyl)-1,1-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine, N,N,N',N'-tetra-p-tolyl-1,1'-biphenyl-4,4'-diamine; N,N'-di-1-naphthyl-N,N'-diphenyl-1,1'-biphenyl-4,4'-diamine; mixtures thereof and the like.

Another class of aromatic tertiary amines that can be utilized is the polynuclear aromatic amines. Examples of such polynuclear aromatic amines include, for example, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like.

Another class of hole transporting materials that can be utilized is comprised of 4,4'-bis(9-carbazolyl)-1,1'-biphenyl compounds, such as, for example, 4,4'-bis(9-carbazolyl)-1, 1'-biphenyl; 4,4'-bis(3-methyl-9-carbazolyl)-1,1'-biphenyl, and the like.

An exemplary class of the hole transporting materials that can be utilized is the indolo-carabazoles, such as those disclosed in U.S. Pat. Nos. 5,942,340 and 5,952,115, which are incorporated herein by reference in their entirety.

Another exemplary class of hole transporting materials that can be utilized is comprised of N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N'-di-1-naphthyl-N,N'-diphenyl-1, 1'-biphenyl-4,4'-diamine, which is more exemplary; N,N'-bis (3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like.

Exemplary hole transporting materials that can be utilized are the naphtyl-substituted benzidine derivatives.

Examples of electron transport material that can be utilized can be selected from metal oxinoid compounds, the oxadiazole metal chelate compounds, the triazine compounds and the stilbene compounds, examples of which are described above.

Other examples of electron transport material that can be utilized are the polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers. See, for example, Bernius et al., "Proceedings of SPIE Conference on Organic Light Emitting Materials and Devices III," Denver, Colo., July 1999, Vol. 3797, p. 129.

A mixed region in between the hole transport region and the electron transport region can be formed using mixtures of any of the suitable exemplary hole transport materials and electron transport materials described herein.

The one or more layers comprising the light emission zone can be prepared by forming one of the above-described materials into thin films by any suitable known or later developed method. Suitable methods for this purpose include, for example, vapor deposition and spin-coating techniques.

The light emission zone can have a thickness ranging from about 10 nm to about 1000 nm. Preferably, this thickness is from about 50 nm to about 250 nm. In embodiments in which the light emission region is comprised of one or more adjacent layers, the thickness of the individual layers can be at least about 5 nm.

The cathode 140 can comprise any suitable metal, including high work function components, having a work function, for example, from about 4.0 eV to about 6.0 eV, or low work function components, such as metals with, for example, a work function of from about 2.5 eV to about 4.0 eV. The cathode can comprise a combination of a low work function (less than about 4 eV) metal and at least one other metal. Effective proportions of the low work function metal to the second or other metal are from less than about 0.1 wt. % to about 99.9 wt. %. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are exemplary low work function metals.

The Mg—Ag alloy cathodes of U.S. Pat. No. 4,885,211 are one exemplary cathode construction. Another exemplary cathode construction is described in U.S. Pat. No. 5,429,884, wherein the cathodes are formed from lithium alloys with other high work function metals such as aluminum and indium. These patents are incorporated herein by reference in their entirety.

The thickness of the cathode 140 can range from, for example, about 10 nm to about 500 nm. Of course, thicknesses outside of this range can also be used.

In an exemplary embodiment, the luminescent zone of the present invention, particularly a luminescent zone that emits blue light is formed in a such a way so as to prevent or at least reduce bimolecular interaction phenomena between molecules in the excited states. For example, the bimolecular interaction can include triplet-triplet diffusion/annihilation, singlet-singlet annihilation, and singlet-triplet diffusion. Generally, these bimolecular interactions have been overlooked, particularly due to the fact that earlier studies showed that OLED degradation during operation is Coulombic in nature, for example, as explained in Tang and Van Slyke, APL, 1996. However, recent studies by the inventors of the present invention show that OLED degradation during operation is Coulombic in green and red-emitting OLEDs, degradation in blue OLEDs is primarily governed by the concentration of excited states, reflected in a faster device degradation in higher luminance devices. The degradation is not proportional to the density of electric current used in driving the OLED. Moreover, recent studies by the inventors of the present invention, demonstrate that the degradation rate dependence on luminance follows an almost quadratic power law dependence (degradation rate $\alpha\ L^n$, $1.4<n<2.4$), thereby confirming the bimolecular interaction nature of the underlying phenomena.

Bimolecular interaction can be reduced in any number of suitable ways. The bimolecular interaction can be reduced by incorporating a triplet quenching material such as a tryethyl amine in the blue emitting luminescence zone. Some organic compounds, when introduced as guests in a host organic material, are capable of quenching the triplet states of the host material without quenching the singlet states. The triplet quenching material can be introduced as dopants in the blue emitting material to quench the undesirable triplet states of the blue emitting material. Alternately, the triplet quenching material can be chemically bonded to the blue emitting material molecules. Quenching the relatively long-lived triplet states can reduce the chances of the triplets from interacting with one another and promoting chemical changes in the blue emitting material. The triplet quenching material can be, for example, 9-methyl anthracene, anthracene, 1-chloroanthracene, 9,10-dibromoanthracene, fluorene, biphenyl, naphthalene, iodonaphthalene, bromonaphthalene, 2-nitrofluorene, coronene, trans-stilbene, 1,6- diphenyl- 1,3,5-hexatriene, 3,4-benzpyrene, acenaphthene, phenanthrene, pyrene, anthracene, ferrocene, azulene, coronene, methylene blue, pheophytin, porphine, thiobenzophenone, 2-(2H-benzotriazol-2-yl)-p-cresol, 2-(2H-benzotriazol-2-yl)-4,6-bis(1-methyl-1-phenylethyl)phenol, 6,13-dichloro-3, 10-diphenyl-triphenodioxazine, 4,4'bis(dimethylamino)thiobenzophenone. 4,4'-bis(dimethylamino)thiobenzophenone Bimolecular interaction can be reduced by incorporating a material with strong spin-orbit coupling properties in the blue emitting luminescence zone. A wide range of organometallic compounds containing a heavy metal atom, such as lanthanides and platinum, are known to have strong spin-orbit coupling properties, and therefore, can reduce triplet states in a host material by facilitating intersystem triplet to singlet transitions. Examples of organometallic compounds containing a heavy metal atom that can facilitate intersystem triplet to singlet transitions include tris-(2-phenylpyridine)iridium, 2,3,7,8,12,13,17,18-octaethylporphine platinum, tris-(4,4,4-trifluoro-1-(2-thienyl)-1,3-butaned-iono)-1,10-phenanthroline europium(III), Eu(acetylacetonato)$_3$, Sm(acetylacetonato)$_3$, Bimolecular interaction can be reduced by incorporating a material with strong absorption properties at the second triplet state (T2) and/or the second singlet state (S2) energy levels of the blue emitting material. These materials provide a convenient manner for dissipating the high energy that could have accumulated on the blue emitting material as a result of energy-pooling events, e.g., $S1+S1 \rightarrow S2+S0$ or $T1+T1 \rightarrow T2+T0$. Examples of materials that can have strong absorption at the second triplet state (T2) and/or the second singlet state (S2) energy levels of the blue emitting material include wide band gap materials with an energy gap for example about 2.7 eV (electron volt) or more, such as carbazoles, bicarbazoles, like; 4,4'-bis(9-carbazolyl)-1,1'-biphenyl compounds, indolocarbazoles, like; 5,11-di-naphthyl-5,11-dihydroindolo[3,2-b]carbazole, and 2,8-dimethyl-5,11-di-naphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like., anthracene compounds, naphthalene compounds and their derivatives Bimolecular interaction can be reduced by increasing the intermolecular distances between the molecules of the blue emitting material. The blue emitting material can be diluted by mixing with other suitable materials in order to reduce bimolecular interactions, for example, to reduce Dexster energy transfer processes and thereby reduce energy pooling processes. A similar effect can be achieved by adopting molecular structures for the blue emitting materials that would shield the lumophores by other molecular groups that do not belong to the same electronic conjugation system of the lumophore, thereby keeping lumophores of neighboring molecules far enough from each other to reduce interaction. Examples of materials that can be mixed with the blue emitters in order to increase intermolecular distances between the individual blue emitter molecules include wide band gap organic or inorganic materials, and wherein the energy band gap is for example about 2.7 eV (electron volt) or more. Examples of suitable wide band gap organic materials include carbazoles, bicarbazoles, like; 4,4'-bis(9-carbazolyl)-1,1'-biphenyl compounds, indolocarbazoles, like; 5,11-di-naphthyl-5,11-dihydroindolo[3,2-b]carbazole, and 2,8-dimethyl-5,11-di-naphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like., anthracene compounds, naphthalene compounds and their derivatives. Examples of suitable wide band gap inorganic materials include metal compounds, such as a metal halide (e.g., fluoride, chloride, bromide, iodide), metal oxide, metal hydroxide, metal nitride, metal sulfide, metal carbide, and a metal boride.

Bimolecular interaction can be reduced by incorporating magnetic fields to reduce the concentration of triplet states. Magnetic fields can influence the rate of initial formation of triplet states and/or their conversation through intersystem crossing to the singlet ground state. Incorporating a magnetic medium, for example a sheet magnet, in an OLED display can therefore reduce bimolecular interaction phenomena through reducing the reactive triplet states. Suitable magnetic fields strengths can for example be magnetic fields with a Gauss rating flux density of no less than 10 KGs (Kilo-Gauss)

The following US patent applications that are commonly owned by the assignee of the present invention can be utilized with the present invention, and are incorporated herein by reference in their entirety: Ser. Nos. 10/909,691; 10/909,689; 10/372,547; 10/702,857; 10/401,238; 11/006,000; 10/774,577; 11/133,977; 11/133,978; 11/133,975; 11/133,752; 11/122,290; 11/122,288; 11/133,753; 11/122,290; 11/122,288; 11/133,753; 11/184,775; and 11/184,776.

While the invention has been described in conjunction with the specific embodiments described above, it is evident that many alternatives, modifications and variations are apparent to those skilled in the art. Accordingly, the preferred embodiments of the invention as set forth above are intended to be illustrative and not limiting. Various changes can be made without departing from the spirit and scope of the invention.

The invention claimed is:

1. An organic electroluminescent device comprising:
    an anode,
    a cathode, and
    a light emitting zone between the anode and cathode having a blue emitting material and a triplet quenching material that is doped in the blue emitting material and quenches the triplet states of the blue emitting material without quenching the singlet states wherein the triplet quenching material reduces at least one of triplet/triplet interaction, and triplet/singlet interaction,
    wherein the device is arranged such that recombination of electrons and holes in the light emitting zone occurs within a magnetic field.

2. The electroluminescent device of claim 1, further comprising a material with strong spin orbit coupling properties.

3. The electroluminescent device of claim 1, further comprising a material that has strong absorption properties for at least one of second triplet states and second singlet states.

4. The electroluminescent device of claim 1, further comprising a material that increases the intermolecular distances between light emitting molecules.

5. The electroluminescent device of claim 1, further comprising a material that includes at least one of
    strong spin orbit properties,
    strong absorption properties at second triplet states and second singlet states, and
    properties of increasing the intermolecular distances between light emitting molecules.

6. The electroluminescent device of claim 2, wherein the material with strong spin orbit coupling properties includes an organometallic compound.

7. An organic electroluminescent device comprising:
    an anode,
    a cathode, and
    a light emitting zone between the anode and cathode having a blue emitting material and a triplet quenching material that is doped in the blue emitting material and quenches the triplet states of the blue emitting material without quenching the singlet states,
    wherein the device is arranged such that recombination of electrons and holes in the light emitting region occurs within a magnetic field having a strength sufficient to reduce at least one of triplet/triplet interaction, triplet/singlet interaction, and singlet/singlet interaction.

8. The electroluminescent device of claim 7, wherein the magnetic field is provided by a sheet magnet.

9. An organic electroluminescent device comprising:
    an anode;
    a cathode; and
    a light emitting zone between the anode and cathode having a mixture of a blue emitting material and a wide band gap material,
    wherein the wide band gap material increases the intermolecular distances between each molecule of the blue emitting material,
    wherein the energy bad gap of the wide band gap material is about 2.7 eV or more,
    wherein the wide band gap material reduces at least one of triplet/triplet interaction, triplet/singlet interaction and singlet/singlet interaction, and
    wherein the device is arranged such that recombination of electrons and holes in the light emitting zone occurs within a magnetic field.

10. The electroluminescent device of claim 9, wherein the wide band gap material is an organic material.

11. The electroluminescent device of claim 9, wherein the wide band gap material is an inorganic material.

* * * * *